(12) United States Patent
Bantignies et al.

(10) Patent No.: US 11,679,975 B2
(45) Date of Patent: Jun. 20, 2023

(54) PANEL TRANSDUCER SCALE PACKAGE AND METHOD OF MANUFACTURING THE SAME

(71) Applicant: VERMON SA, Tours (FR)

(72) Inventors: Claire Bantignies, Tours (FR); Guillaume Férin, Truyes (FR)

(73) Assignee: VERMON SA, Tours (FR)

( * ) Notice: Subject to any disclaimer, the term of this patent is extended or adjusted under 35 U.S.C. 154(b) by 17 days.

(21) Appl. No.: 17/629,210

(22) PCT Filed: Jul. 23, 2020

(86) PCT No.: PCT/IB2020/000739
§ 371 (c)(1),
(2) Date: Jan. 21, 2022

(87) PCT Pub. No.: WO2021/014222
PCT Pub. Date: Jan. 28, 2021

(65) Prior Publication Data
US 2022/0289562 A1    Sep. 15, 2022

Related U.S. Application Data

(60) Provisional application No. 62/878,080, filed on Jul. 24, 2019.

(51) Int. Cl.
*B81C 1/00* (2006.01)
*B81B 7/00* (2006.01)

(52) U.S. Cl.
CPC ........ *B81C 1/00095* (2013.01); *B81B 7/0006* (2013.01); *B81B 2201/0271* (2013.01);
(Continued)

(58) Field of Classification Search
CPC ........ B81C 1/00095; B81C 2201/0194; B81C 2203/0792; B81B 7/0006;
(Continued)

(56) References Cited

U.S. PATENT DOCUMENTS

2012/0118475 A1    5/2012  Baumgartner
2013/0050226 A1    2/2013  Shenoy et al.
(Continued)

FOREIGN PATENT DOCUMENTS

| CN | 102527627 A | 7/2012 |
| WO | 2017/143307 A1 | 8/2017 |
| WO | 2019/086496 A1 | 5/2019 |

OTHER PUBLICATIONS

European Patent Office, International Search Report and Written Opinion issued in corresponding Application No. PCT/IB2020/000739, dated Jan. 22, 2021.
(Continued)

*Primary Examiner* — Yasser A Abdelaziez
(74) *Attorney, Agent, or Firm* — Stites & Harbison, PLLC; Jeffrey A. Haeberlin; James R. Hayne

(57) ABSTRACT

A method of manufacturing a panel transducer scale package includes securing acoustic components at predetermined locations on a first carrier substrate with a first surface of the acoustic components positioned adjacent to the first carrier substrate. ASIC components are also secured at predetermined locations on the first carrier substrate with a first surface of the ASIC components positioned adjacent to the first carrier substrate. Photoresist resin is applied over the acoustic components and the ASIC components such that a second surface of the acoustic components is left exposed from the photoresist resin. The first carrier substrate is removed to expose the first surface of the acoustic components and the first surface of the ASIC components. A buildup layer is formed including electrical pathways between each of the acoustic components and the ASIC components, and the photoresist resin is removed.

16 Claims, 4 Drawing Sheets

(52) U.S. Cl.
  CPC ..... *B81B 2207/012* (2013.01); *B81B 2207/07* (2013.01); *B81C 2201/0194* (2013.01); *B81C 2203/0792* (2013.01)

(58) Field of Classification Search
  CPC ...... B81B 2201/0271; B81B 2207/012; B81B 2207/07; G10K 11/004; B06B 1/0622; B06B 1/0629
  See application file for complete search history.

(56) References Cited

U.S. PATENT DOCUMENTS

| | | | |
|---|---|---|---|
| 2015/0259194 A1* | 9/2015 | Lin | B81C 1/0023 257/773 |
| 2017/0043375 A1* | 2/2017 | Weekamp | H10N 30/872 |
| 2017/0209898 A1 | 7/2017 | Henneken et al. | |
| 2021/0020538 A1* | 1/2021 | Chen | H01L 21/32051 |

OTHER PUBLICATIONS

Wang, Z. "3-D Integration and Through-Silicon Vias in MEMS and Microsensors," Journal of Microelectromechanical Systems, vol. 24, No. 5, pp. 1211-1244, Oct. 1, 2015.
China National Intellectual Property Administration, Notification of the First Office Action issued in corresponding Application No. 202080048694.X, dated Feb. 9, 2023.

\* cited by examiner

PANEL TRANSDUCER SCALE PACKAGE AND METHOD OF MANUFACTURING THE SAME

RELATED APPLICATIONS

This application claims the benefit of U.S. Provisional Application No. 62/878,080, filed Jul. 24, 2019, the entire disclosure of which is incorporated herein by this reference.

FIELD OF THE INVENTION

The present disclosed subject matter relates to an ultrasound panel transducer scale package with embedded integrated circuits (ICs) for cable count reduction, system simplification, and digital systems in medical imaging and therapy and ultrasound non-destructive testing (NDT).

BACKGROUND OF THE INVENTION

Current ultrasound matrix arrays exhibit several thousands of very small individual elements to achieve volumetric imaging. Each of these elements needs to individually be analogically driven by electronics (e.g., analog front-end ("AFE")). However, an imaging system for such an ultrasound matrix array would be too expensive and the system complexity would be much too high. Further, cabling for such a system requires thousands of wires, and therefore is too big and too heavy for practical use.

So imaging system manufacturers have developed several strategies to reduce the number of independent electronic channels. Some of these strategies include: micro-beam formation and/or signal multiplexing such as time domain multiplexing. These strategies exhibit a reduction factor between 1:9 and 1:64, and even more. All of these techniques rely on integrating ICs close to the active ultrasound matrix array (e.g., in a probe housing the ultrasound matrix array). The ultrasound matrix array can be either a bulk piezoelectric component, or a capacitive or piezoelectric silicon-based micro-machined transducer (CMUT or PMUT). One or more ICs are required to dramatically decrease the number of connections and independent channels.

One existing solution is based on direct IC attachment to the matrix transducer through a vertical architecture in which one or several application-specific integrated circuits (ASIC) are attached to each other and connected with wire bonding technologies and finally the acoustic module is flip-chipped onto the topmost IC. The interconnection module offers several advantages since the ICs are not required to exhibit the same footprint and element arrangement as the acoustic module. Thus, one or several ICs could be used for every probe topology without having to develop an ASIC for each topology. However, there are some limitations since current technologies do not allow interconnection at fine pitches (below 200 µm) and of large arrays (over 60×60) unless adding several layers of conductor tracks, thus dramatically reducing the flexibility of such printed circuits. With respect to this first strategy, it is noted that each transducer (i.e., acoustic module) configuration (i.e., arrangement of elements and pitch) requires a different, specific IC. The development of the IC is very expensive and it is absolutely not reconfigurable.

Another existing solution uses an interconnection module in which the module can be a foldable flexible printed circuit or a solid interposer which interface each element of the acoustic modules to the deported ICs. Of note, this second strategy is still a vertical integration. With respect to the interposer of this second strategy, some have attempted to solve the configurability issue by inserting an interposer material which adapts the pitch or even deports the interconnection, but at the expense of interconnection module complexity.

Lastly, modular approaches have been proposed where multiple acoustic modules are aligned and assembled together to overcome flex limitations. The whole system is mechanically aligned, but with possible uncertainty on element positions in translation and rotation that are unacceptable with regards to beam formation. This is a horizontal integration but the number of elements that are addressable is smaller and works for normal pitches.

BRIEF SUMMARY OF THE INVENTION

The present invention is directed to a panel transducer which allows for interfacing a high density ultrasound matrix array with integrated circuits (ICs) and to methods of manufacturing a panel transducer scale package.

In some exemplary implementations of the method, one or more acoustic components and one or more ASIC components are secured at predetermined locations on a first carrier substrate with first surface of the one or more acoustic components positioned adjacent to the first carrier substrate and a first surface of the one or more ASIC components positioned adjacent to the first carrier substrate. A photoresist resin is then applied over the one or more acoustic components and the one or more ASIC components such that a second surface of the one or more acoustic components is left exposed from the photoresist resin. The first carrier substrate is then removed to expose the first surface of the one or more acoustic components and the first surface of the one or more ASIC components. A buildup layer is formed including electrical pathways between the first surface of each of the one or more acoustic components and the first surface of at least one of the one or more ASIC components. Finally, the photoresist resin is removed.

According to some exemplary implementations of the method, each electrical pathway connects one acoustic element of one of the one or more the acoustic components to one pad of one of the one or more ASIC components.

According to some exemplary implementations of the method, a frame defining slots for each of the one or more acoustic components and each of the one or more ASIC components is first provided. Each of the one or more acoustic components is positioned into a corresponding slot of the frame with the first surface of the acoustic component aligned with an exterior surface of the frame. Each of the one or more ASIC components is also positioned into a corresponding slot of the frame with the first surface of the ASIC component aligned with the exterior surface of the frame. The first carrier substrate is then bonded to the first surface of each of the one or more acoustic components and the first surface of each of the one or more ASIC components, and the one or more acoustic components and the one or more ASIC components are removed from the frame via the first carrier substrate.

According to some exemplary implementations of the method, after applying the photoresist resin over the one or more acoustic components and the one or more ASIC components, excess photoresist resin is then removed to expose the second surface of the of the one or more acoustic components.

According to some exemplary implementations of the method, after applying the photoresist resin over the one or more acoustic components a second carrier substrate is applied over the photoresist resin and the exposed second surface of the one or more acoustic components.

According to some exemplary implementations of the method, the first surface of the one or more acoustic components is subdiced to form a plurality of acoustic elements. In some exemplary implementations, prior to securing the one or more acoustic components on a first carrier substrate, the one or more acoustic components are fully metallized. The subdicing then separates the metallized layer on the first surface into electrodes for the plurality of acoustic elements. According to some exemplary implementations, the metallized layer is applied through physical vapor deposition to a thickness of around 200 nm.

According to some exemplary implementations of the method, the step of forming the buildup layer comprises depositing an insulation layer on the first surface of the one or more acoustic components, the first surface of the one or more ASIC components, and the photoresist layer; forming via holes through the insulation layer; and depositing a conductive layer over the insulation layer to form vias in each of the via holes and electrical tracks across the insulation layer.

In some exemplary implementations, the buildup layer comprises a plurality of insulation layers with vias extending between the plurality of insulation layers and electrical tracks extending between adjacent insulation layers.

In some exemplary implementations, the insulation layer is formed with a thickness of about 3 μm or less.

In some exemplary implementations, the insulation layer is formed of a polyimide.

In some exemplary implementations, the via holes are formed with a femtosecond laser.

In some exemplary implementations, each of the one or more acoustic components includes a plurality of acoustic elements on the first surface of the acoustic component and each of the one or more ASIC components includes a plurality of pads on the first surface of the ASIC component. The via holes are then formed through the insulation layer at a location of each of the plurality of acoustic elements of the acoustic components and each of the plurality of pads of the ASIC components.

In some exemplary implementations, the first carrier substrate is an ultraviolet tape.

In some exemplary implementations, the second carrier substrate is an ultraviolet tape.

BRIEF DESCRIPTION OF THE DRAWINGS

Embodiment herein will hereinafter be described in conjunction with the appended drawings and illustrations provided to illustrate and not limit the scope of the claims:

DETAILED DESCRIPTION OF EXEMPLARY EMBODIMENTS OF THE INVENTION

The present invention is directed to a panel transducer which allows for interfacing a high density ultrasound matrix array with integrated circuits (ICs).

Figure 1:
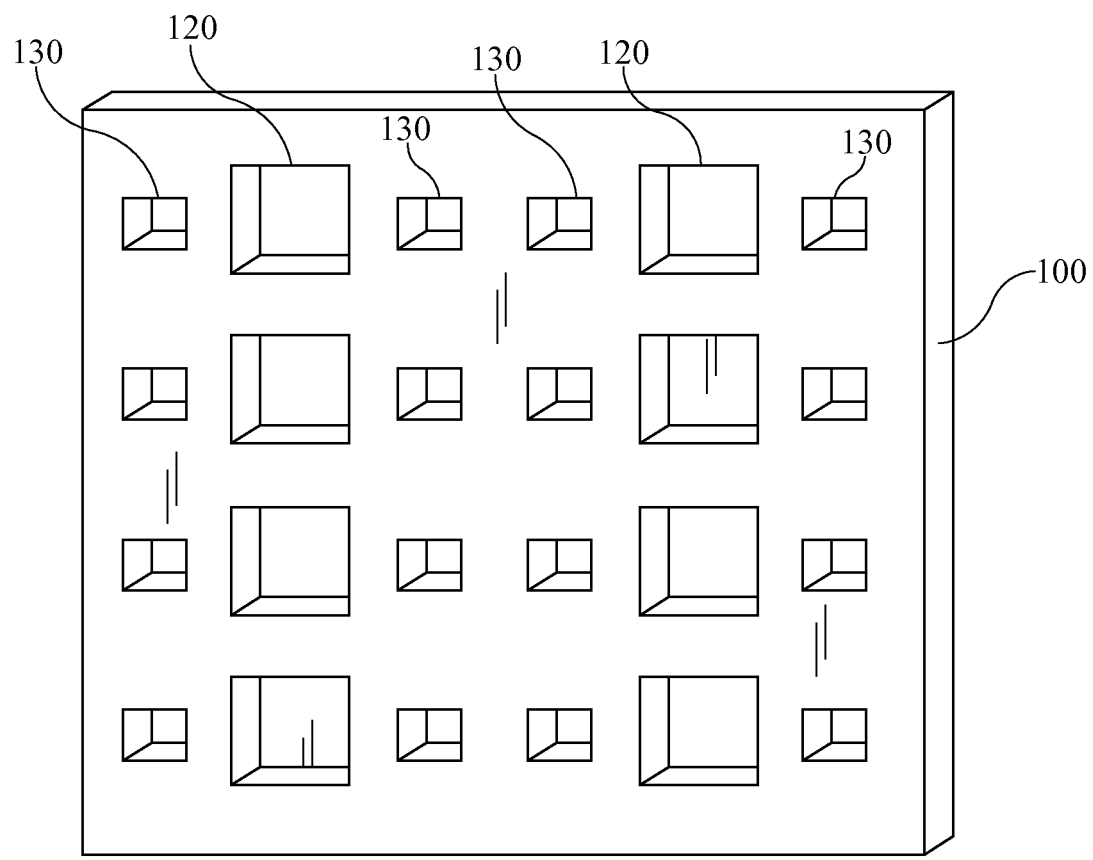
FIG. 1 is a perspective view of an exemplary frame used in the manufacture of panel transducer made in accordance with the present invention.

Referring first to FIG. 1, one exemplary implementation of the present invention begins with providing a frame 100 that defines a plurality of acoustic component slots 120 and a plurality of application-specific integrated circuits (ASIC) component slots 130. In the exemplary embodiment shown in FIG. 1, there are two rows of acoustic component slots 120 with ASIC components slot 130 provided on either side of each of the acoustic component slots 120. As described below, the frame 100 shown in FIG. 1 will therefore ultimately result in eight panel transducers with each panel transducer having one acoustic component connected to two ASIC components located on opposite sides of the acoustic component. Of course, other frames with different configurations of acoustic component slots and ASIC component slot can also be used, depending on the desired final number and configuration of panel transducers.

Figure 2:
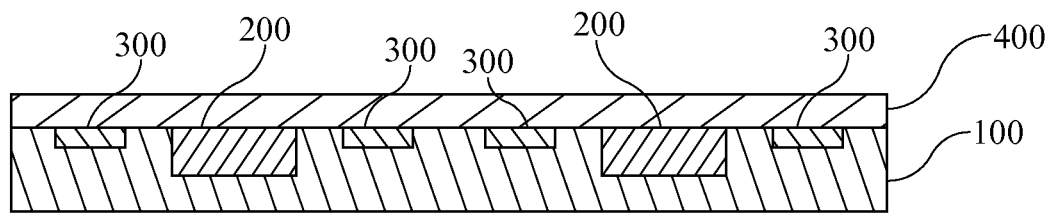
FIG. 2 is a schematic section view illustrating a first carrier substrate application process.

Referring now to FIGS. 1 and 2, acoustic components 200 and ASIC components 300 are first positioned into each of the corresponding slots 120, 130 of the frame 100. A first carrier substrate 400, e.g., UV tape, is then placed over the frame 100 and bonded to the acoustic components 200 and the ASIC components 300. Of note, a first surface (i.e., upper surface in FIG. 2) of each of the acoustic components 200 is aligned with an exterior surface of the frame 100 and a first surface (i.e., upper surface in FIG. 2) of each of the ASIC components 300 is aligned with an exterior surface of the frame 100. In this way, the first surface of each of the acoustic components 200 is positioned adjacent to the first carrier substrate 400 and the first surface of each of the ASIC components 300 is positioned adjacent to the first carrier substrate 400. The first carrier substrate 400 is then used to remove the acoustic components 200 and ASIC components 300 from the frame 100. In some alternative implementations, rather than using a UV tape, a glass wafer bonded to the acoustic components 200 and ASIC components 300 with UV glue can be used as the first carrier substrate 400. However, in either event, the first carrier substrate 400 is sufficiently rigid to allow the acoustic components 200 and the ASIC components 300 to be removed from the frame 100 while maintaining their relative positions.

The frame 100 advantageously allows for precise placement of the acoustic components 200 and ASIC components 300 on the first carrier substrate 400 in relation to each other. In one exemplary embodiment, the frame 100 is made of plastic with the slots 120, 130 precision molded to ensure that, when the respective components 200, 300 are positioned within the slots 120, 130, the components 200, 300 are located within a desired degree of precision. Other methods of precision placement of the components 200, 300, such as a pick and place method are also possible without departing from the spirit and scope of the present invention. In either event, the acoustic components 200 and the ASIC components 300 are secured to the first carrier substrate 400 at predetermined locations.

With respect to the acoustic components 200 in particular, in some exemplary embodiments, the acoustic components 200 are fully metallized, for example through physical vapor deposition. As discussed below, a subdicing step will separate the metallized layer on one main surface of the acoustic components 200 into electrodes for the elements forming the acoustic transducer array. The main surface of the acoustic elements 200 opposite to this diced surface is the closest surface to the ultrasound propagation medium. The full metallization of this second main surface acts as an electrical shielding and a common ground electrode for all the transducer array elements. As the acoustic component 200 is fully metallized, this shielding is therefore prolonged and in electrical continuity on its lateral facets. A continuation of this shield is obtained on the first main surface by keeping a part of the metallization on the perimeter of this surface during the dicing step as discussed below.

Figure 3:
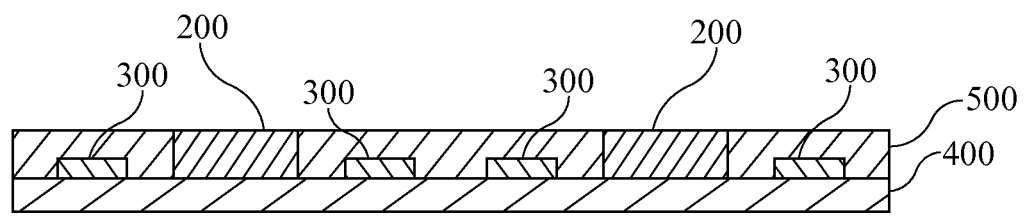
FIG. 3 is a schematic perspective section view illustrating a photoresist resin application process.

Referring now to FIG. 3, once the acoustic components 200 and ASIC components 300 are secured to the first carrier substrate 400 in their predetermined locations and removed from the frame 100, the first carrier substrate 400 with attached components 200, 300 is flipped and a photoresist resin 500 is applied over the acoustic components 200 and ASIC components 300. As shown in FIG. 3, the photoresist resin 500 completely encases the ASIC components 300, but leaves a second surface (i.e., upper surface in FIG. 3) of the acoustic components 200 exposed. To this end, in some embodiments, the photoresist resin 500 is over molded on the first carrier substrate 400 to completely encase both the ASIC components 300 and the acoustic components 200, but excess resin is later removed (e.g., through grinding) to expose the second surface of the acoustic components 200.

Figure 4:
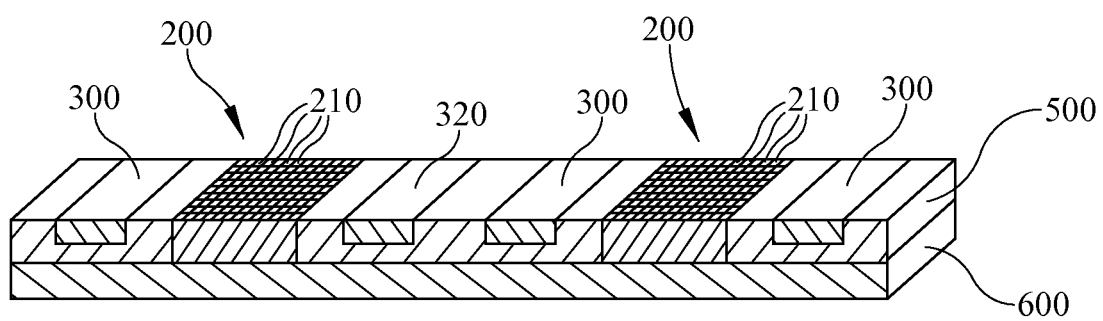
FIG. 4 is a schematic section view illustrating a subdicing process.

Referring now to FIG. 4, after the second surface of the acoustic components 200 is exposed, a second carrier substrate 600 is applied opposite from the first carrier substrate 400. That is to say, the second carrier substrate 600 is applied over the photoresist resin 500 and the exposed second surface of the acoustic components 200. As shown in FIG. 4, the resulting subassembly is inverted and the first carrier substrate 400 is removed to leave exposed the first surface of each of the acoustic components 200 and the first surface of each of the ASIC components 300. Advantageously, the acoustic components 200 and the ASIC components 300 are now embedded within the photoresist resin 500 with the first surface of each acoustic component 200 and the first surface of each ASIC component 300 positioned at the same level.

Similar to the first carrier substrate 400, in some embodiments the second carrier substrate 600 is UV tape, while in other embodiments the second carrier substrate 600 is a glass wafer bonded to the acoustic components 200 and ASIC components 300 with UV glue. In either event, the second carrier substrate 600 is sufficiently rigid to manipulate the acoustic components 200 and the ASIC components 300 during further manufacturing steps while maintaining their relative positions.

Referring still to FIG. 4, once the first surfaces of the acoustic components 200 are exposed, an optional step is performed of subdicing the acoustic components 200 into a plurality of acoustic elements 210 forming an array across the first surface of the acoustic components 200. The optional subdicing step is not necessary in all applications, but it is contemplated that subdicing is necessary in embodiments where the acoustic components 200 are fully metallized, as previously discussed. Full metallization and subdicing is preferred in the manufacture of bulk PZT transducers while the manufacturing process of piezoelectric silicon-based micro-machined transducers (PMUT) and capacitive silicon-based micro-machined transducers (CMUT) will typically have other opportunities to provide separated electrodes on a same first surface.

In some exemplary embodiments, the acoustic elements 210 are arranged in an array and function as a high density ultrasound matrix array transducer. According to some embodiments, the acoustic elements 210 are arranged in a square array that is 30×30 (i.e., there are a total of 1024 elements), but the particular size and shape of the array of elements is determined by the size and shape of the related transducer array. For example, in some embodiments, there are at least thirty elements in the smallest dimension while in other embodiments there is in the order of 100 elements in the each dimension (i.e., in the order of 10,000 elements). Likewise, rectilinear, circular, and random arrangements of the elements are also contemplated.

In some exemplary embodiments, the acoustic elements 210 themselves are also square having a width and a length of about 150 µm, but the particular size and shape of the acoustic elements 210 is also not limited. The spacing, or pitch, of the acoustic elements 210 can also vary, but in some embodiments, the pitch of the acoustic elements 210 is between about 20 µm to about 500 µm in each direction. Of course, the distances need not be the same in each direction and pitches may vary for apodization purposes.

In view of the above, it should be understood that the subdicing step must be performed with high precision. For example, in embodiments where the surfaces are metallized through physical vapor deposition, resulting in a metal layer with thickness around 200 nm, the subdicing can be performed with a femtosecond laser to a depth of a few tenths of a µm.

In some exemplary embodiments, the ASIC components 300 already have pads (not show) formed on the first surface of the ASIC components 300 prior to positioning the ASIC component 300 in the frame 100 shown in FIGS. 1 and 2. Accordingly, these pads would be exposed at the upper surfaces of the ASIC components 300 in FIG. 4.

Referring now to FIGS. 5-8, a buildup layer 900 is then formed over the subassembly of FIG. 4 with the buildup layer 900 including electrical pathways 910 between the acoustic components 200 and the ASIC components 300.

Figure 5:
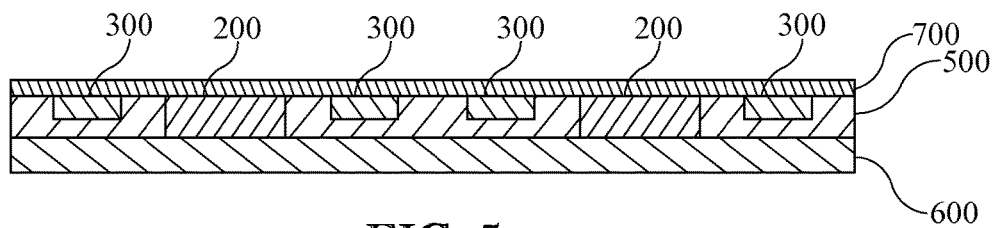
FIG. 5 is a schematic section view illustrating an insulation application process.

With respect to FIG. 5 in particular, in a first step of forming the buildup layer 900, an initial insulation layer 700 is deposited over the acoustic components 200, ASIC components 300, and photoresist resin 500. In some exemplary embodiments the initial insulation layer 700 is a polyimide and formed with a thickness of about 3 µm or less and preferably about 2 µm or less. It is contemplated that the initial insulation layer 700 can be formed by any means known in the art, but in some exemplary embodiments, it is formed by spin-coating or spray-coating. Advantageously, spin coating of the initial insulation layer 700 provides for a natural planarization.

Figure 6:
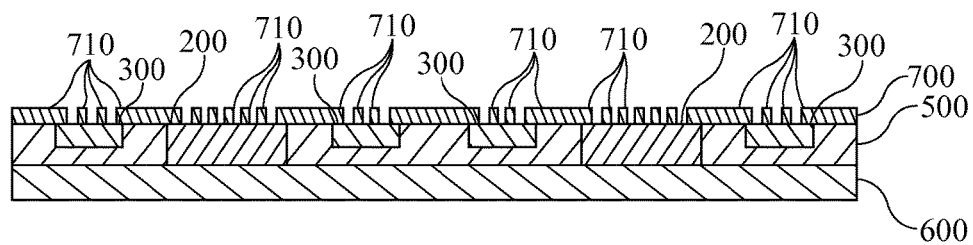
FIG. 6 is a schematic section view illustrating a via hole formation process.

Referring now to FIG. 6, a plurality of via holes 710 are then formed through the initial insulation layer 700. These via holes 710 are drilled with a diameter of a few microns to thereby provide discrete access to each of the individual elements 210 of the acoustic components 200 as well as each of the pads of the ASIC components 300. In some exemplary implementations of the present invention, the via holes 710 are drilled with a femtosecond laser. By appropriately setting the strength of the laser, the insulation layer 700 is removed without affecting the underlying elements or pads. In other exemplary implementations, the via holes 710 are formed by dry and/or wet etching (e.g., with potassium hydroxide), or the use of a dry film photoresist (e.g., thermal barrier coating).

Advantageously, when a polyimide is used for the initial insulation layer 700, due to the relatively thin thickness of the insulation layer 700, in combination with the relatively clear nature of polyimides, the location of the elements or pads can be verified through visual means thus ensuring that the via holes 710 are accurately positioned. It is contemplated that this visual verification may overcome any lack of precision due to cutting with a laser as compared to utilizing a mask.

Figure 7:
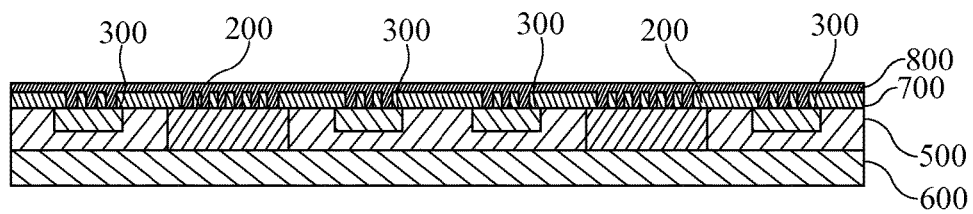
FIG. 7 is a schematic section view illustrating a conductor application process.

Referring now to FIG. 7, an initial conductive layer 800 is deposited over the initial insulation layer 700 to form vias in each of the via holes 710 and well as electrical tracks across the initial insulation layer 700. In some exemplary implementations, the initial conductive layer 800 is formed by first depositing a conductor material, such as gold or copper, across the entirety of the initial insulation layer 700 (as shown in FIG. 7) and then removing excess material, for example by laser ablation or other etching processes (e.g., LASER, plasma etching, dry etching, wet etching, mechanical grinding, chemical mechanical planarization), leaving the vias and electrical tracks across the initial insulation layer 700. In other exemplary implementation, the initial conductive layer 800 is formed by selective deposition of the conductive materials using as mask, for example through a photolithographic process. In either event, resulting tracks are typically less than 10 μm wide and about 1 μm deep.

Figure 8:
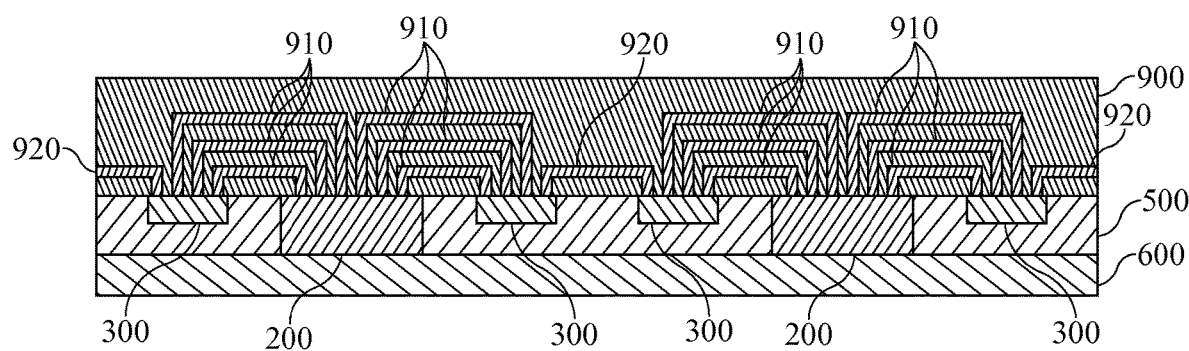
FIG. 8 is a schematic section view illustrating a completed buildup layer as an intermediate step in the manufacture of panel transducer made in accordance with the present invention.

Referring now to FIG. 8, the above steps of depositing an insulation layer, forming via holes at predetermined locations through the insulation layer, and depositing a conductive layer over the insulation layer to form vias and tracks are repeated to ultimately result in the buildup layer 900 shown in FIG. 8. In other words, the buildup layer 900 includes a plurality of insulation layers with vias extending between the plurality of insulation layers and electrical tracks extending in between two adjacent insulation layers. In embodiments where spin coating is used when depositing the various insulation layers, the natural planarization of each insulation layer reduces or eliminates height mismatches in the locations of the tracks and vias.

As mentioned above, the buildup layer 900 includes electrical pathways 910 between the acoustic components 200 and the ASIC components 300. More specifically, each of the acoustic elements 210 of each acoustic component 200 is connected to one pad of one of the ASIC components 300. The buildup layer 900 provides greater routing flexibility for the electrical pathways 910, allowing for a greater number of elements 210 of the acoustic component 200 to be in electrical communication with the ASIC components 300. Likewise, it is a relatively simple matter to modify the manufacture of the buildup layer 900 to match particular acoustic components 200 to ASIC components 300 depending on the intended use of the resulting panel transducer.

Furthermore, as shown in FIG. 8, there are also one or more additional electrical pathways 920 extend away from the ASIC components 300 which do not connect to an acoustic component 200. These additional electrical pathways 920 are later utilized to connect the ASIC components 300 to external systems or components, as discussed further below.

Figure 9:
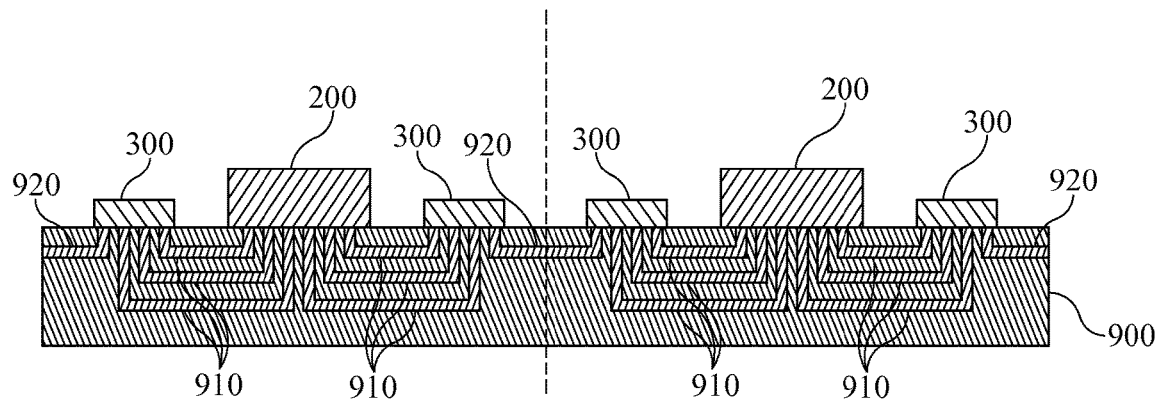
FIG. 9 is a schematic section view illustrating an intermediate assembly prior to dicing as an intermediate step in the manufacture of panel transducer made in accordance with the present invention.

Referring now to FIG. 9, after the buildup layer 900 is completed, the second carrier substrate 600 and the photoresist layer 500 are removed, leaving an intermediate assembly shown in FIG. 9. This intermediate assembly is then diced along the dashed line shown in FIG. 9 to produce exemplary panel transducers of the present invention. The photoresist layer 500 is then removed by one of various means including, for example, using an adequate solvent; using a sacrificial material at the interface; or UV curing (thermal barrier coating).

As previously mentioned, in some exemplary embodiments, the acoustic components 200 are fully metallized such that the metal layer on the perimeter of the acoustic components 200 functions as the ground for the acoustic component 200. Although not expressly shown, such a grounding metal layer on the perimeter of the acoustic component 200 is electrically connected to a ground of the ASIC components 300.

Figure 10:
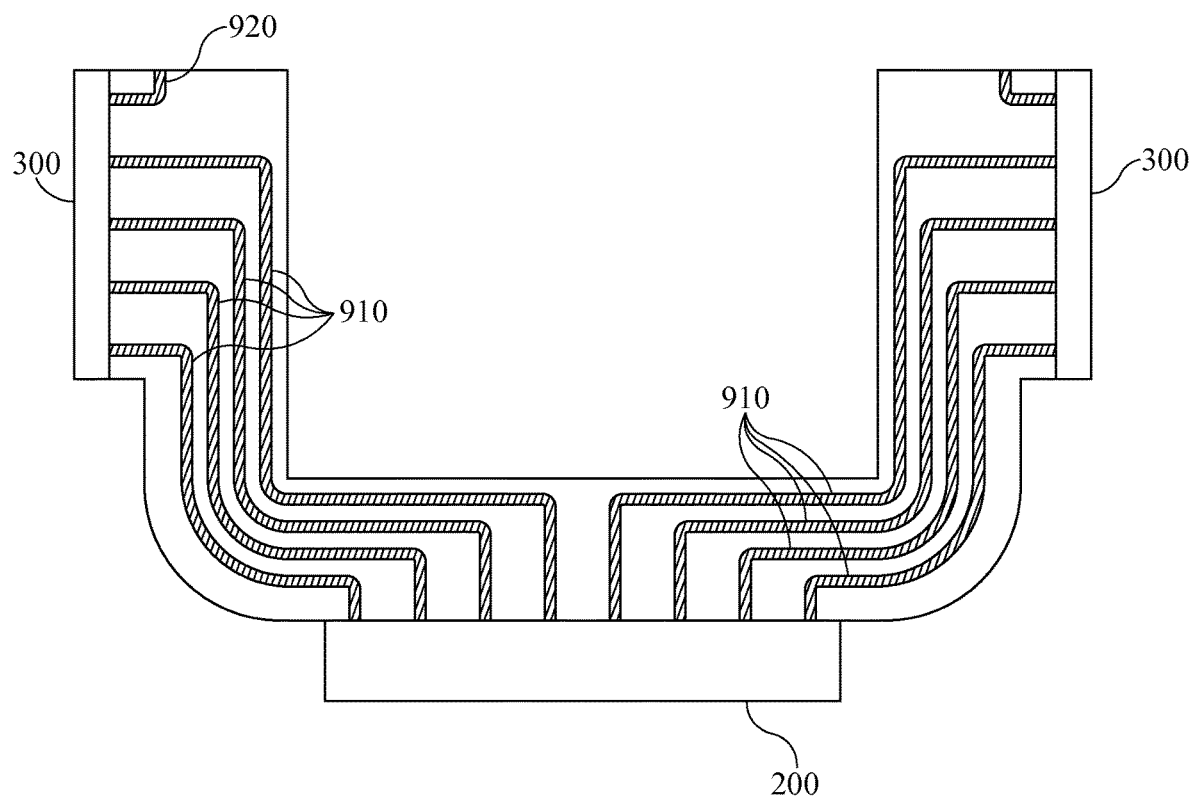
FIG. 10 is a schematic section view of an exemplary panel transducer made in accordance with the present invention.

Referring now to FIG. 10, an exemplary panel transducer made in accordance of the present invention is capable of folding to thereby reduce the overall size of the transducer package in comparison to the size of the acoustic component 200.

As previously mentioned, each element 210 of the acoustic component 200 is connected to a specific ASIC component 300 by electrical pathways 910 and each of the ASIC components 300 are thereby in electrical communication with a specific group of elements 210 of the acoustic component 200. Rather than relying on a direct communication between an external system and each element 210 of the acoustic component 200, each ASIC components 300 allows for local control of a group of elements 210 of the acoustic component 200. Inclusion of the ASIC components 300 therefore provides a significant decrease in the number of connections to the external system.

The externally extending electrical pathways 920 then allows electrical signals to pass between the ASIC component 300 and an external system. For example, upon creating the transducer package shown in FIG. 10, this package is affixed to a PCB (with extra electronic components) by way of the externally extending electrical pathways 920 towards a connector or any other usual interconnection scheme such as flex to PCB or flex to wire electrical connection, using anisotropic conductive adhesive, soldering, etc. The transducer package is thereby integrated into an ultrasonic probe and these externally extending electrical pathways 920 provide for communication to an external system including, for example, imaging equipment, displays, user controls, and the like. According to some exemplary embodiments of the present invention, the panel transducer shown in FIG. 10 is configured to be enclosed within a housing of an ultrasonic probe.

Although the above exemplary embodiments illustrate only two ASIC components 300 provided on either side of each of the acoustic component 200, different geometries are possible. For example, PCT App. No. PCT/IB2020/051481, incorporated herein by reference, describes a variety of different geometries and folding techniques for flexible folding substrates including acoustic components electrically connected to a plurality of integrated circuits.

In some alternate implementations, the buildup layer 900 is first manufactured and then the acoustic components 200 and the ASIC components 300 are bonded to the buildup layer 900 as a final step.

In either instance, the design of the buildup layer 900 should take into account the mechanical alignment tolerances of: i) the acoustic components 200 and the ASIC components 300; and ii) the intermediate layers of the buildup layer 900.

Advantageously, by preparing the buildup layer 900 through repeated steps of depositing an insulation layer, forming via holes at predetermined locations through the insulation layer, and depositing a conductive layer over the insulation layer to form vias and tracks, there is no need to provide extra tolerances for connecting multiple layers or components. The processing also allows for decreased spacing for the vias and tracks. Accordingly, there is much higher circuit density in the buildup layer 900. Likewise, there is no planarity issue cause when stacking multiple layers.

Furthermore, each of the manufacturing steps are all highly accurate, reliable, reproducible, and cost effective due to their automated nature. As previously mentioned, it is also much easier to reconfigure the buildup layer 900 to connect a new acoustic component and/or a new integrated circuit.

There is also a high yield of the hybrid interconnection because there is no need for additional assembly steps and assembly layers. In embodiments which utilize a femtosecond laser source, the process is safe for active materials, and there is good material ablation selectivity with high spatial resolution and reduced redeposition pollution of the ablated material.

The methods of the present invention described above are equally viable for both wafer packages and panel packages and with resulting sizes of about 2 inches to about 12 inches.

One of ordinary skill in the art will recognize that additional embodiments are possible without departing from the teachings of the present invention. This detailed description, and particularly the specific details of the exemplary embodiment disclosed therein, is given primarily for clarity of understanding, and no unnecessary limitations are to be understood therefrom, for modifications will become obvious to those skilled in the art upon reading this disclosure and may be made without departing from the spirit or scope of the invention.

What is claimed is:

1. A method of manufacturing a panel transducer scale package, the method comprising the steps of:
    securing one or more acoustic components at predetermined locations on a first carrier substrate, a first surface of the one or more acoustic components positioned adjacent to the first carrier substrate;
    securing one or more ASIC components at predetermined locations on the first carrier substrate, a first surface of the one or more ASIC components positioned adjacent to the first carrier substrate;
    applying a photoresist resin over the one or more acoustic components and the one or more ASIC components such that the one or more acoustic components and the one or more ASIC components are embedded within the photoresist resin and a second surface of the one or more acoustic components is left exposed from the photoresist resin;
    removing the first carrier substrate to expose the first surface of the one or more acoustic components and the first surface of the one or more ASIC components;
    forming a buildup layer over the one or more acoustic components, the one or more ASIC components, and the photoresist resin, the buildup layer including electrical pathways between the first surface of each of the one or more acoustic components and the first surface of at least one of the one or more ASIC components; and
    removing the photoresist resin.

2. The method of claim 1, wherein each electrical pathway connects one acoustic element of one of the one or more the acoustic components to one pad of one of the one or more ASIC components.

3. The method of claim 1, further comprising the steps of:
    providing a frame defining slots for each of the one or more acoustic components and each of the one or more ASIC components;
    positioning each of the one or more acoustic components into a corresponding slot of the frame with the first surface of the acoustic component aligned with an exterior surface of the frame;
    positioning each of the one or more ASIC components into a corresponding slot of the frame with the first surface of the ASIC component aligned with the exterior surface of the frame;
    bonding the first carrier substrate to the first surface of each of the one or more acoustic components and the first surface of each of the one or more ASIC components; and
    removing the one or more acoustic components and the one or more ASIC components from the frame via the first carrier substrate.

4. The method of claim 1, wherein, after applying the photoresist resin over the one or more acoustic components and the one or more ASIC components, removing excess photoresist resin to expose the second surface of the of the one or more acoustic components.

5. The method of claim 1, further comprising applying a second carrier substrate over the photoresist resin and the second surface of the one or more acoustic components.

6. The method of claim 1 and further comprising subdicing the first surface of the one or more acoustic components to form a plurality of acoustic elements.

7. The method of claim 6, wherein, prior to securing the one or more acoustic components on a first carrier substrate, the one or more acoustic components are fully metallized, such that the subdicing separates the metallized layer on the first surface into electrodes for the plurality of acoustic elements.

8. The method of claim 7, wherein, the metallized layer is applied through physical vapor deposition to a thickness of around 200 nm.

9. The method of claim 1, wherein the step of forming the buildup layer comprises:
    depositing an insulation layer on the first surface of the one or more acoustic components, the first surface of the one or more ASIC components, and the photoresist layer;
    forming via holes through the insulation layer; and
    depositing a conductive layer over the insulation layer to form vias in each of the via holes and electrical tracks across the insulation layer.

10. The method of claim 9, wherein the buildup layer comprises a plurality of insulation layers with vias extending between the plurality of insulation layers and electrical tracks extending between adjacent insulation layers.

11. The method of claim 9, wherein the insulation layer is formed with a thickness of about 3 μm or less.

12. The method of claim 9, wherein the insulation layer is formed of a polyimide.

13. The method of claim 9, wherein the via holes are formed with a femtosecond laser.

14. The method of claim 9, wherein each of the one or more acoustic components includes a plurality of acoustic elements on the first surface of the acoustic component and each of the one or more ASIC components includes a plurality of pads on the first surface of the ASIC component; and wherein via holes are formed through the insulation layer at a location of each of the plurality of acoustic elements of the acoustic components and each of the plurality of pads of the ASIC components.

15. The method of claim 1, wherein the first carrier substrate is an ultraviolet tape.

16. The method of claim 1, wherein the second carrier substrate is an ultraviolet tape.

* * * * *